METHOD OF MAKING A MULTILAYER CONTACT SYSTEM FOR SEMICONDUCTOR DEVICES

Original Filed Sept. 30, 1965 2 Sheets-Sheet 1

INVENTOR
Edwin A. Domel
Larry G. Lands
Sam S. McCleese, Jr.
BY
John D. Graham
ATTORNEY INVENTOR
Edwin A. Domel
Larry G. Lands
Sam S. McCleese, Jr.

BY John W. Graham
ATTORNEY

United States Patent Office 3,499,213
Patented Mar. 10, 1970

3,499,213
METHOD OF MAKING A MULTILAYER CONTACT SYSTEM FOR SEMICONDUCTOR DEVICES

Larry G. Lands and Sam S. McCleese, Jr., Garland, and Edwin A. Domel, Richardson, Tex., assignors to Texas Instruments Incorporated, Dallas, Tex., a corporation of Delaware Continuation of application Ser. No. 491,674, Sept. 30, 1965. This application May 21, 1968, Ser. No. 743,579
Int. Cl. B01j *17/00;* H01l *7/00*
U.S. Cl. 29—577 4 Claims

ABSTRACT OF THE DISCLOSURE

A method of making contact to a body is disclosed wherein a body is provided with a layer of titanium and a layer of aluminum on top of the titanium. A portion of the aluminum layer is removed and the exposed portion of the titanium is oxidized; the remainder of the aluminum layer preventing oxidation of the underlying titanium.

This application is a continuation of Ser. No. 491,674, filed Sept. 30, 1965, and now abandoned.

This invention relates to semiconductor devices, and more particularly to ohmic contacts for transistors, integrated circuits or the like, and to the methods of making such contacts.

Ohmic contacts to semiconductor devices must be composed of materials which have good chemical, electrical, thermal and mechanical properties. While problems in making contacts exist for all types of semiconductors, the selection of contact materials is particularly important when the semiconductor is silicon, such as in planar transistors and integrated circuits, for example, where silicon is most commonly used.

In planar semiconductor devices, a silicon oxide coating usually overlies the silicon surface except in the actual contact areas, this coating functioning to passivate the junctions and provide an insulating base for expanded contacts and interconnections. Particularly in integrated circuits, strips of conductor material extend from one semiconductor region up over the oxide coating and across various regions and junctions of the device to contact another region. Accordingly, the contact must exhibit good adherence to silicon and to the silicon oxide, but yet must not produce any undesirable reaction with nor penetrate either the silicon or silicon oxide.

In addition, the contact should provide a low resistance ohmic contact to the semiconductor surface; and if the contact metal used is a donor or acceptor in the semiconductor, it must have a low solubility so that the tendency to form a junction can be thwarted by heavy doping of the contact area.

The material, or materials, from which the contact is fabricated should not form an alloy with the semiconductor material at temperatures used in bonding the leads to, or packaging the device. Formation of such an alloy would result in an undesirable penetration into the shallow semiconductor regions. In addition, the contact metal should not have a melting point below the temperature at which the contact will be exposed in subsequent processing and device operation. The technique for applying the contact material should be convenient, inexpensive, and permit working with the very small geometries associated with integrated circuits, high frequency transistors and the like.

Aluminum, because of its excellent conductivity and high melting point, because films of excellent quality can be deposited by conventional evaporation techniques, and because it can be selectively removed from undesired areas by conventional photographic masking and etching techniques, has proven to be very desirable as a contact metal. Nevertheless, despite its several advantages as a contact material for use on semiconductor devices, aluminum, when directly applied to the silicon surface, often results in electrical degradation of the device in the form of shorts, high leakage currents, decreased gain and undesirably low reverse breakdown characteristics. This degradation is particularly severe when the thermal oxide and/or a glass coating over the junction is thin, which is usually the case in high frequency planar transistors.

With the above difficulties in mind, it is an object of this invention to provide improved contacts and interconnections for semiconductor devices, particularly silicon planar transistors and integrated circuits of the type having silicon oxide coatings thereon. It is another object of the invention to provide a contact which utilizes the desirable qualities of aluminum and avoids the electrical degradation of the device associated with the aluminum. It is a further object of the invention to provide an improved bimetal contact system which employs a method of application that is convenient, inexpensive, and permits working with the small geometries associated with high frequency semiconductor devices and integrated circuits.

In accordance with these and other objects and features, the invention pertains to a bimetal contact system for a semiconductor device, for example a silicon semiconductor device, comprising a first thin film of titanium making direct contact to the silicon material and the silicon oxide coating overlying the silicon material, and a second thin film layer of aluminum overlying the thin film of titanium. The thin film of titanium is first applied to the surface of the semiconductor device by evaporation, typically over the entire face of the silicon wafer having the silicon oxide coating, with openings in the oxide having been previously etched in the contact areas. The layer of aluminum is subsequently evaporated over the titanium layer. The aluminum layer is then removed with standard photographic masking and etching techniques, leaving a thin strip of aluminum in the desired contact or interconnection pattern. Due to the great difficulty, however, in etching titanium, a novel and unique procedure is followed in removing the titanium layer in the unwanted areas. Accordingly, the titanium layer is completely oxidized except for that portion which lies underneath the aluminum strip, the aluminum strip serving as a mask to limit the oxidation of the titanium layer. The resulting contact pattern is a narrow expanded contact or interconnection comprising the titanium-aluminum layers, with the titanium oxide serving as an additional insulating layer above the silicon oxide.

The titanium layer provides a good electrical path between the silicon and the aluminum layer; its adherence to the silicon and to the silicon oxide is excellent, and the high melting point (1820° C.) allows its use at ordinary processing and operating temperatures without degrading the device characteristics. In addition, the bimetal system substantially avoids the electrical degradation of the device occurring when the aluminum layer alone is used as the contact to the silicon surface.

The novel features believed characteristic of this invention are set forth in the appended claims. The invention itself, however, as well as other objects and advantages thereof, may best be understood by reference to the following detailed description of the illustrative embodiments when read in conjunction with the accompanying drawings, wherein:

Figure 1:
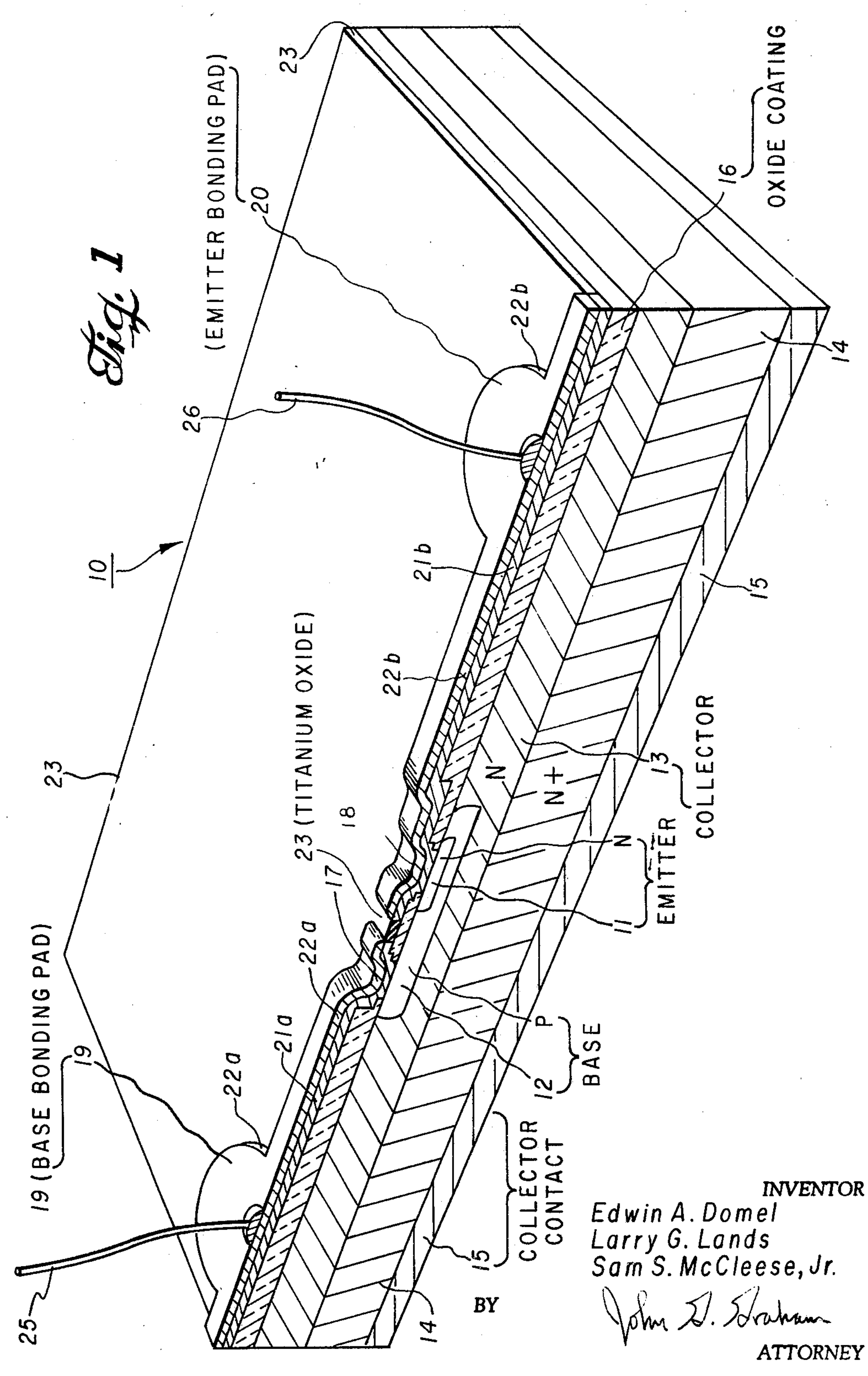
FIGURE 1 is a plan isometric view in section of a wafer of a semiconductor material having a planar junction transistor formed therein, ohmic contact to the emitter and base regions, respectively, of the transistor made with the bimetallic contact of this invention.

Referring now to FIGURE 1, there is depicted a semiconductor wafer 10 having a transistor formed therein comprising an N-type emitter region 11, a P-type base region 12 and an N-type collector layer 13. A very low resistivity layer 14 provides a low resistance contact for the collector contact 15. The transistor is formed by conventional planar techniques, using successive diffusions with silicon oxide masking. This process leaves an oxide coating 16 on a top surface of the wafer, the coating over the collector layer 13 being thicker than over the base region 12 and leaving the stepped configuration shown in FIGURE 1.

For high frequencies, the geometry of the active part of the transistor is extremely small, the elongated emitter region 11 being perhaps 0.1 to 0.2 mil wide and less than a mil long. The base region 12 is about 1 mil square. The pair of holes 17 and 18 is provided in the oxide layer 16 by etching, for example, the base and emitter contacts respectively comprising a first layer 21*a* and 21*b* of titanium and a second layer 22*a* and 22*b* of aluminum. Due to the extreme small size of the actual base and emitter contact areas, approximately one or two tenths of a mil in width, the contacts must be expanded out over the silicon oxide layer 16 by way of narrow fingers or strips, about one or two tenths of a mil or less, the strips terminating in base bonding pad 19 and emitter bonding pad 20. The pads 19 and 20 are large enough to permit bonding of 0.7 to 1 mil external wires 25 and 26 thereto. A titanium oxide layer 23 overlies the silicon oxide layer 16 except in the location of the titanium layers 21*a* and 21*b*. The bulk of the wafer 10 forms the collector region 13, and the collector contact 15 may be applied to the lower face of the wafer adjacent the low resistivity layer 14. The size of the semiconductor wafer is selected for convenience in handling, with a typical size for the wafer 10 being about 30 mils on each side and about 4 mils thick (these dimensions are not to scale in the drawing). Typically, the wafer 10 is merely a small undivided part of a large slice of silicon, perhaps one inch in diameter and eight mils thick, the slice being scribed and broken into individual wafers after the contacts have been applied.

Figure 2:
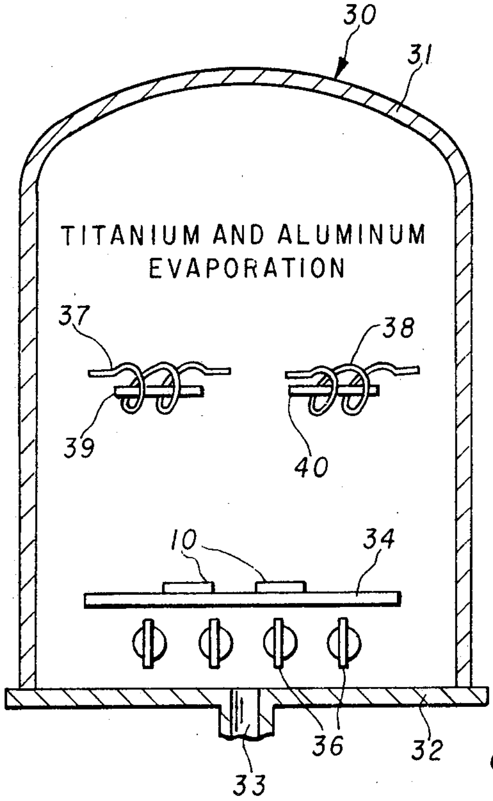
FIGURE 2 is a schematic representation of the evaporation chamber suitable for carrying out the method of applying the contacts of the invention to a semiconductor device.

With reference to FIGURE 2, there is now described the method of depositing the thin film layers 21*a* and 21*b* of titanium and 22*a* and 22*b* of aluminum forming the emitter and base contacts, respectively, as shown in FIGURE 1. The apparatus for this deposition includes an evaporation chamber 30 which comprises the bell jar 31 mounted on a base plate 32. An opening 33 in the base plate is connected to a vacuum pump (not shown) for evacuating the chamber. A platform 34 is mounted above the base plate 32 by means not shown and serves as the work holder for a plurality of silicon slices 10, each of which has formed at its upper face, in undivided form, dozens or hundreds of the transistors of the kind indicated in FIGURE 1. Below the platform 34 a bank of quartz infrared tubes 36 are positioned, these functioning to heat the platform and the slices to any desired temperature and to hold the slice temperature at a selected point with a fair degree of precision. A suitable temperature control, including a thermocouple and a feedback arrangement (not shown), is provided for this purpose. As an alternative to heating the platform 34 with the quartz infrared tubes, resistance heating may be employed. About 4 inches above the platform 34 there are positioned tungsten coils 37 and 38 for evaporating charges 39 of titanium and 40 of aluminum, respectively.

The chamber 30 is evacuated to a pressure of approximately $5\times10^{-6}$ torr, and the infrared tubes 36 are energized to bring the temperature of the platform 34 and the slices 10 up to approximately 600° C. The tungsten filament 37 is then energized to deposit a titanium layer to a thickness of perhaps 200 to 300 angstroms upon the entire top face of each slice 10, the holes for the emitter and base contacts having already been cut. The power applied to the infrared tubes 36 is thereafter decreased slightly so that the platform 34 and the slices 10 cool to approximately 300° C., and the tungsten filament 38 is then energized to deposit an aluminum film to a thickness of perhaps 20 to 25 microinches upon the entire top face of each slice over the titanium film. The deposition of the aluminum should be done as soon as possible after the deposition of the titanium because there appears to be a tendency for a film of titanium oxide to immediately form over the titanium due to the oxygen residue in the vacuum system.

In order to insure a good ohmic contact and mechanical adherence, it may be desirable to subject the wafer 10 to a conventional pre-evaporation cleaning procedure.

After removing the slice 10 from the evaporation chamber 30, the excess portion of the aluminum coating is removed by conventional photographic masking and etching techniques, leaving the layers 22*a* and 22*b* in the desired contact configuration, as shown in FIGURE 1. For example, a thin coating of photoresist polymer, which may be Eastman Kodak KMER, is applied to the entire top surface of the wafer or slice 10. The photoresist is exposed to ultraviolet light through a mask which allows the light to reach the areas where the aluminum film is to remain, and then subjected to photodeveloping solution. The unexposed photoresist is then removed by the photodeveloping solution, a layer of etch-resistance photoresist overlying the titanium and aluminum layers remaining in a pattern corresponding to the desired expanded emitter contact and bonding pad 20 and the expanded base contact and bonding pad 19, as shown in FIGURE 1. The slice 10 is now subjected to an etching solution to remove the unwanted portion of the aluminum layer. A suitable etch solution, for example 70 milliliters phosphoric acid, 15 milliliters acetic acid, 3 milliliters nitric acid and 5 milliliters of deionized water, is applied for approximately 15 seconds at a temperature of about 60° C. to 70° C. After the unwanted aluminum is etched away, the etch-resistant photoresist mask, which has remained intact during the etching step, is now removed by rinsing in a solvent such as methylene chloride.

In order to remove the unwanted portion of the titanium film, to leave the layers 21*a* and 21*b* in the desired contact arrangement, the silicon slice is baked in oxygen or air at about 400° C. for approximately 45 minutes, resulting in the complete oxidation of the titanium layer except for the portion immediately underlying the aluminum layers 22*a* and 22*b*. The aluminum layers 22*a* and 22*b* serve as masks to limit the oxidation to only that portion of the titanium layer which is not underneath the aluminum layers 22*a* and 22*b*. The temperature at which the oxidation of the exposed titanium layer is carried out (approximately 400° C.) is below that temperature which is required before the aluminum oxidizes at any appreciable rate. For example, at 400° C. the titanium oxidizes at a rate of approximately 235 angstroms per hour, while the oxidation rate of the aluminum is approximately 10 angstroms per hour. Consequently any aluminum oxide that might form will be negligible, and will not impair device characteristics.

The resulting contact structure is as seen in FIGURE 1, wherein the expanded contacts terminating in the bonding pads 19 and 20 comprise a first layer 21*a* and 21*b* of titanium metal making direct contact to the silicon semiconductor material of the base and emitter regions, respectively, and an aluminum layer 22*a* and 22*b* immediately overlying the titanium layers 21*a* and 21*b*. The oxidized titanium layer 23 adjacent the unoxidized titanium layers, overlies the silicon oxide layer 16 and provides increased electrical insulation. External connecting wires 25 and 26 of gold or aluminum, for example, may be bonded directly to the base bonding pad 19 and to the emitter bonding pad 20, respectively.

In order to provide good low resistance ohmic contact to the silicon, it may be desirable to dope the regions of the silicon to a high impurity concentration at the locations where the titanium layers are to make contact.

Figure 3:
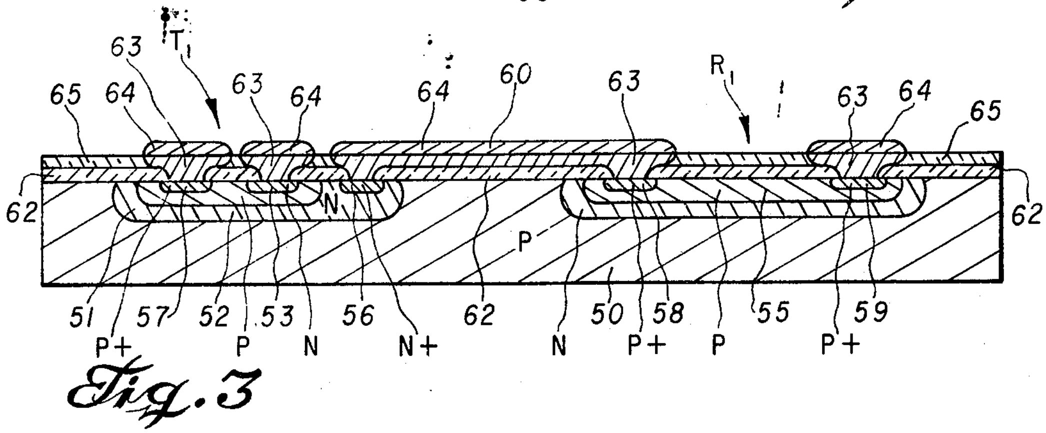
FIGURE 3 is an elevational view in section of a portion of an integrated circuit showing the use of the bimetallic structure of this invention for contacts and interconnections.

Referring now to FIGURE 3 there is depicted the use of the bimetal contact structure of the present invention in an integrated circuit application. A sectional view of a portion of a completed integrated circuit is shown with a NPN transistor $T_1$ and a resistor $R_1$ having been formed in the common P-type semiconductor body 50. Any techniques known in the art may be used to form the transistor $T_1$ and the resistor $R_1$, for example epitaxial depositions and/or diffusion operations. In the particular embodiment shown in FIGURE 3, an N-type diffused region 51 provides the collector of the transistor, a P-type diffused region 52 provides the base of the transistor, while an elongated P-type region 55 formed simultaneously with the base 52 provides the resistor $R_1$. An N-type diffused region 53 provides the transistor emitter, and a low resistivity N+ layer 56 and a low resistivity P+ layer 57 formed adjacent the collector and base, respectively, in order to allow for low resistance contact areas to these regions. P+ regions 58 and 59 also provide low resistance contact regions to the resistor $R_1$.

The diffusion operations utilize a conventional silicon oxide masking resulting in an oxide layer 62 on the final device. Thereafter holes are cut in the oxide coating 62 where the transistor contacts and the resistor contacts are to be made, the surface cleaned, and the evaporation procedures as set forth above are used to apply the titanium coating and the aluminum coating to the top surface of the device. The aluminum coating is selectively removed as before and the titanium coating selectively oxidized to produce the insulating titanium oxide layer 65. The resulting structure includes the contacts and interconnections shown, each comprising a first layer 63 of titanium and a second layer 64 of aluminum. It is seen that the collector is connected to one end of the resistor by the interconnection 60 which extends over the oxide layer 62. A typical integrated circuit would include, in the same semiconductor wafer, many interconnected transistors and resistors of the type depicted in FIGURE 3, as well as other components such as field-effect transistors, metal oxide semiconductor devices, and thin film resistors and capacitors.

While the invention has been described with reference to the specific methods and embodiments, it is to be understood that this description is not to be construed in a limiting sense. For example, it may be desirable to deposit another metallic layer, or layers, over the titanium-aluminum contact structure before applying external connecting wires. This is particularly applicable when gold wires are to be bonded to the contact structure for the external connecting wires. It has been observed that when gold wires are bonded directly to aluminum, a compound $AuAl_2$ exhibiting a purple color and referred to in the industry as the "purple plague" is formed. This compound is brittle and device reliability decreases as a result of its formation. Consequently another metallic layer of, say molybdenum or nickel, may be formed above the aluminum layer at the bonding pads before applying the gold wires; this additional layer serves to chemically isolate the aluminum from the gold to avoid formation of the "purple plague" while at the same time it insures good electrical conductivity between the gold wire and the titanium-aluminum contact structure.

Various other modifications of the disclosed embodiments, as well as other embodiments of the invention will become apparent to persons skilled in the art without departing from the spirit and scope of the invention as defined by the appended claims.

What is claimed is:

1. A method of making a contact and interconnection to a semiconductor body, comprising the steps of: providing a semiconductor body having a bottom layer comprised of titanium on said body and a top layer comprised of aluminum on said bottom layer comprised of titanium, selectively removing said layer comprised of aluminum, thereby forming the aluminum portion of said contact and interconnection and exposing a portion of said layer comprised of titanium, and oxidizing said exposed portion of said layer comprised of titanium, said aluminum portion preventing the oxidization of the layer comprised of titanium underlying said aluminum portion, thereby forming the titanium portion of said contact and interconnection.

2. The method as defined in claim 1 wherein said layer comprised of titanium and said layer comprised of aluminum are formed by successive evaporations.

3. A method of making contacts and interconnections to a semiconductor device comprising the steps of: providing a semiconductor substrate having first and second zones of opposite conductivity types forming a P-N junction therebetween terminating at one surface of said substrate beneath an insulating layer on said one surface, said insulating layer defining at least one hole therein exposing at least one portion of said zones, a metallic layer on and adherent to said insulating layer and ohmically connecting to at least one exposed portion of said zones, said metallic layer having a bottom layer comprised of titanium and a top layer comprised of aluminum on said bottom layer comprised of titanium, comprising the steps of: selectively removing a portion of said top layer comprised of aluminum, thereby forming the aluminum portion of said contacts and interconnections and exposing a portion of said bottom layer comprised of titanium, and oxidizing said exposed portion of said layer comprised of titanium, said aluminum portion preventing the oxidation of the layer comprised of titanium underlying said aluminum portion, thereby forming the titanium portion of said contacts and interconnections.

4. The method defined in claim 3 wherein said layer comprised of titanium and said layer comprised of aluminum are formed by successive evaporations.

References Cited

UNITED STATES PATENTS 3,169,892 2/1965 Lemelson.

PAUL M. COHEN, Primary Examiner

U.S. Cl. X.R.

29—578, 589